(12) United States Patent  
Bleiweiss et al.

(10) Patent No.: US 10,769,862 B2  
(45) Date of Patent: Sep. 8, 2020

(54) GENERATION OF SYNTHETIC 3-DIMENSIONAL OBJECT IMAGES FOR RECOGNITION SYSTEMS

(71) Applicant: INTEL CORPORATION, Santa Clara, CA (US)

(72) Inventors: Amit Bleiweiss, Yad Binyamin (IL); Chen Paz, Modiin (IL); Ofir Levy, Jerusalem (IL); Itamar Ben-Ari, Givat HaShlosha (IL); Yaron Yanai, Modiin (IL)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 16/053,135

(22) Filed: Aug. 2, 2018

(65) Prior Publication Data

US 2018/0357834 A1    Dec. 13, 2018

Related U.S. Application Data

(63) Continuation of application No. 14/969,563, filed on Dec. 15, 2015, now Pat. No. 10,068,385.

(51) Int. Cl.
```
G06T 15/00        (2011.01)
G06T 19/20        (2011.01)
```
(Continued)

(52) U.S. Cl.
CPC ............ *G06T 19/20* (2013.01); *G06F 30/00* (2020.01); *G06K 9/00201* (2013.01);
(Continued)

(58) Field of Classification Search
CPC .............................. G06T 19/20; G06T 15/00
(Continued)

(56) References Cited

U.S. PATENT DOCUMENTS 6,157,387 A    12/2000  Kotani
9,665,800 B1    5/2017  Kuffner
(Continued)

FOREIGN PATENT DOCUMENTS

EP       1703470        9/2006
KR     100735676        7/2007
(Continued)

OTHER PUBLICATIONS

Dosovitskiy, Learning to Generate Chairs with Convolutional Neural Networks, IEEE Conference on Computer Vision and Pattern Recognition (CVPR), 2015, pp. 1538-1546 (Year:2015).

(Continued)

*Primary Examiner* — Thomas J Lett
(74) *Attorney, Agent, or Firm* — Finch & Maloney PLLC

(57) ABSTRACT

Techniques are provided for generation of synthetic 3-dimensional object image variations for training of recognition systems. An example system may include an image synthesizing circuit configured to synthesize a 3D image of the object (including color and depth image pairs) based on a 3D model. The system may also include a background scene generator circuit configured to generate a background for each of the rendered image variations. The system may further include an image pose adjustment circuit configured to adjust the orientation and translation of the object for each of the variations. The system may further include an illumination and visual effect adjustment circuit configured to adjust illumination of the object and the background for each of the variations, and to further adjust visual effects of the object and the background for each of the variations based on application of simulated camera parameters.

22 Claims, 8 Drawing Sheets
(3 of 8 Drawing Sheet(s) Filed in Color)

(51) Int. Cl.

| | |
|---|---|
| *G06N 20/00* | (2019.01) |
| *G06K 9/00* | (2006.01) |
| *G06F 30/00* | (2020.01) |
| *G06T 3/20* | (2006.01) |
| *G06T 3/40* | (2006.01) |
| *G06T 3/60* | (2006.01) |
| *G06T 15/20* | (2011.01) |
| *G06T 15/50* | (2011.01) |
| *G06T 17/00* | (2006.01) |

(52) U.S. Cl.
CPC ............... *G06N 20/00* (2019.01); *G06T 3/20* (2013.01); *G06T 3/40* (2013.01); *G06T 3/60* (2013.01); *G06T 15/00* (2013.01); *G06T 15/20* (2013.01); *G06T 15/50* (2013.01); *G06T 17/00* (2013.01); *G06K 2209/40* (2013.01)

(58) Field of Classification Search
USPC ......................................................... 345/426
See application file for complete search history.

(56) References Cited

U.S. PATENT DOCUMENTS

| | | | |
|---|---|---|---|
| 9,898,856 B2* | 2/2018 | Yang | ....................... G06T 5/006 |
| 2009/0297061 A1 | 12/2009 | Mareachen et al. | |
| 2010/0158355 A1 | 6/2010 | Najafi et al. | |
| 2010/0260438 A1 | 10/2010 | Morikawa et al. | |
| 2010/0289817 A1 | 11/2010 | Meier et al. | |
| 2011/0002531 A1 | 1/2011 | Heisele et al. | |
| 2011/0187860 A1 | 8/2011 | Antikidis et al. | |
| 2012/0306876 A1 | 12/2012 | Shotton et al. | |
| 2012/0320039 A1 | 12/2012 | Ha et al. | |
| 2013/0141530 A1 | 6/2013 | Zavesky | |
| 2014/0079314 A1 | 3/2014 | Yakubovich et al. | |
| 2014/0195921 A1 | 7/2014 | Grosz et al. | |
| 2014/0232631 A1 | 8/2014 | Fleischmann et al. | |
| 2014/0294237 A1 | 10/2014 | Litvak et al. | |
| 2014/0355830 A1 | 12/2014 | Park | |
| 2015/0043806 A1 | 2/2015 | Karsch et al. | |
| 2016/0134858 A1* | 5/2016 | Xie | ......................... G01S 15/87 348/46 |
| 2017/0085863 A1 | 3/2017 | Lopez et al. | |
| 2017/0337693 A1* | 11/2017 | Baruch | ................... G06T 7/168 |
| 2018/0150713 A1* | 5/2018 | Farooqi | ................... G06N 20/00 |

FOREIGN PATENT DOCUMENTS

| | | |
|---|---|---|
| KR | 1020150068088 | 6/2015 |
| WO | 2014182545 | 11/2014 |
| WO | 2015083199 | 6/2015 |

OTHER PUBLICATIONS

Advisory Action received in U.S. Appl. No. 15/077,976 (dated Jul. 22, 2019) (7 pages).
Su, H. et al., "Multi-view Convolutional Neural Networks for 3D Shape Recognition", Proceedings of the IEEE International Conference on Computer Vision, 2015, pp. 945-953.
Non Final Rejection received in U.S. Appl. No. 15/077,976 (dated Aug. 10, 2017) (11 pages).
Krull, A. et al., "Learning Analysis-by-Synthesis for 6D Pose Estimation in RGB-D Images", Computer Vision (ICCV), Dec. 2015, 9 pages.
Su, H. et al., "Render for CNN: Viewpoint Estimation in Images Using CNN's Tranined with Rendered 3D Model Views", Stanford University, 2015, 9 pages.
International Search Report and Written Opinion for International Patent Application PCT/US2017/018377, dated May 26, 2017, 15 pages.
International Search Report for International Patent Application PCT/US2016/062028, dated Feb. 14, 2017, 5 pages.
Rozantsev, A. et al., "On Rendering Synthetic Images for Training an Object Detector", arXiv:1411.7911v1, Nov. 28, 2014, 30 pages.
Gupta, S. et al., "Aligning 3D Models to RCB-D Images of Cluttered Scenes", 2015 IEEE Conference on Computer Vision and Pattern Recognition (CVPR), IEEE, Jun. 7, 2015, pp. 4731-4740.
Supplementary European Search Report for International Patent Application No. EP17770776, dated Oct. 17, 2019, 8 pages.

* cited by examiner

300A

302

304

306

308

310

312

GENERATION OF SYNTHETIC 3-DIMENSIONAL OBJECT IMAGES FOR RECOGNITION SYSTEMS

CROSS-REFERENCE TO RELATED APPLICATION

This application is a continuation application and claims the benefit of U.S. patent application Ser. No. 14/969,563, filed on Dec. 15, 2015, the entire content of which is herein incorporated by reference.

BACKGROUND

Machine learning systems typically require large image databases that offer a relatively wide variance of images in order to robustly support computer vision based applications. Some existing commercial databases have tens of millions of images arranged in a hierarchical format where each object is depicted by thousands of images. It can often take years to capture and tag all of the necessary images for inclusion in such databases. Additionally, the efforts of many people are generally required to review and maintain the database. This approach is inefficient, expensive and not easily scalable. For example, in an object recognition system, adding a new object to the list of recognized objects would require capturing images of that object from multiple camera orientations, with different object poses, different lighting environments and varying scene backgrounds, to name just a few of the image depiction variables. Some existing systems rely on manual capture techniques to obtain the relatively massive quantities of data that are needed. Other systems employ web crawler software to search the internet and gather up image data in an ad hoc manner, wherever it can be found. Either approach, however, is unsatisfactory given the size of the image databases that are required.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

Generally, this disclosure provides techniques for rendering multiple variations of 3-dimensional (3D) object images based on a 3D model of the object. Each rendered 3D image comprises a pair of 2-dimensional (2D) images: one of which provides a color image, where each pixel may have a standard red-green-blue (RGB) value; and the other provides a depth image, where each pixel encodes depth as a grayscale value. 3D images may be referred to as RGB-D images herein to emphasize that they are represented by a paring of a color image and a depth image. The generated synthetic 3D images can then be used as input to a machine learning system, which in turn outputs a classifier for real world object recognition. Any desired number of renderings may be synthesized and then employed by the machine learning system, for example, to generate, train or test an object recognition classifier. The techniques include generation of varying background scenes, adjustment of object pose, and application of illumination and other visual effects, for each rendering, to provide an efficient way to automatically build a database of image renderings of the object, and without the typical overhead associated with manual capture. Such a database may thus encompass a relatively wide sample variation that is suitable to building a robust classifier that can support computer vision based applications and other such image processing applications.

The techniques described herein for synthesizing image variations provide for generally increased efficiency compared to existing manual or semi-manual methods that capture real world images. In some embodiments, the described techniques may be used to automatically generate 3D image data (e.g., including color and depth) spanning the order of millions of variations. The techniques can be implemented in hardware or software or a combination thereof.

Figure 1:
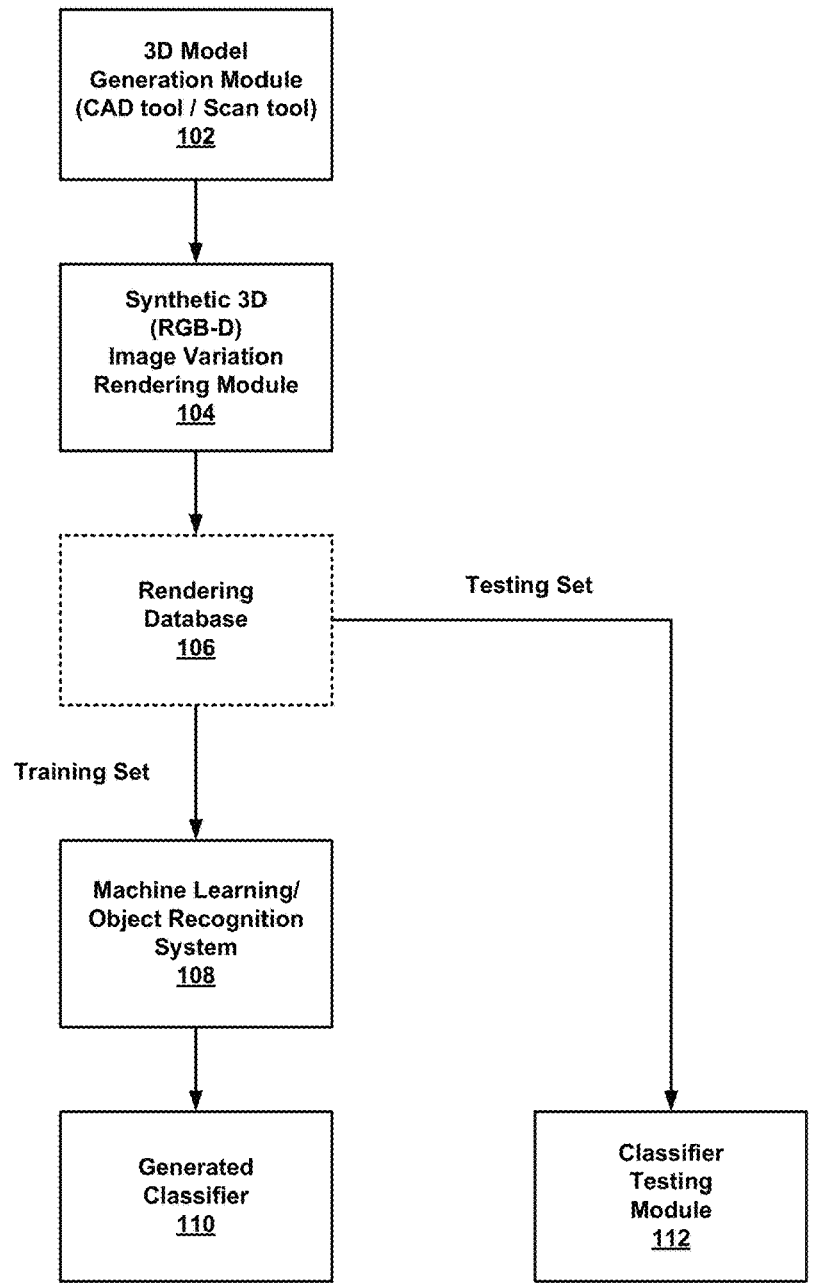
FIG. 1 is a top level block diagram of a system to render 3D object image variations, in accordance with certain of the embodiments disclosed herein.

FIG. 1 is a top level block diagram 100 of a system to render variations of RGB-D object images, in accordance with certain of the embodiments disclosed herein. The system is shown to include a 3D model generation module 102, a synthetic RGB-D image variation rendering module 104, a rendering database 106, a machine learning/object recognition system 108, a classifier 110 and a classifier testing module 112.

The 3D model generation module 102 may be configured to generate a 3D model of the object of interest. The 3D model generally defines or represents the 3D surface of the object, either through a mathematical representation or through a collection of points in a 3D coordinate space that may be connected by geometric shapes such as polygons. In some embodiments, the model may be provided by the manufacturer of the object. The model may be generated by a computer aided design (CAD) tool, for example as part of the process of designing the object. Alternatively, the model may be created by a 3D scanning tool configured to scan a physical sample of the object. In yet another alternative, the model may be created by a designer using a 3D sculpting tool, or by any other known techniques in light of the present disclosure.

The synthetic 3D (RGB-D) image variation rendering module 104 may be configured to synthesize or render any desired number of 3D images of the object, based on the 3D model, where each rendering is associated with a variation of one or more image parameters, as will be described in greater detail below in connection with FIG. 2. The synthesized 3D images include both color data (RGB) and depth data and maybe referred to as RGB-D images.

An optional rendering database 106 may be configured to store the rendered image variations produced by synthetic 3D (RGB-D) image variation rendering module 104. In some embodiments, a first subset of these stored image renderings may be used as training images for generation of a classifier, and a second subset of the image renderings may be used for testing the classifier.

The machine learning/object recognition system 108 may be configured to generate an object recognition classifier based on any desired number of the rendered image variations provided by synthetic 3D (RGB-D) image variation rendering module 104. The recognition classifier may be trained on the image variations using any known techniques in light of the present disclosure.

The generated classifier 110 may thus be configured to recognize the object when it subsequently appears in a new image under different visual conditions and potentially in different object poses. Classifier testing module 112 (which in some embodiments may be a component of machine learning/object recognition system 108) may be configured to test the generated classifier 110 using any suitable number of different image variations from rendering database 106.

It will be appreciated, for example, that a manufacturer or vendor of an item or object (or any number of such items) may possess 3D models for each of the items in its inventory or catalog. The system described herein may be used to synthesize, for example, thousands of image variations for each item which may then be used to generate a recognition classifier capable of recognizing any of the manufacturer's cataloged items, as they might subsequently appear in any arbitrary real word image under any arbitrary visual conditions.

Figure 2:
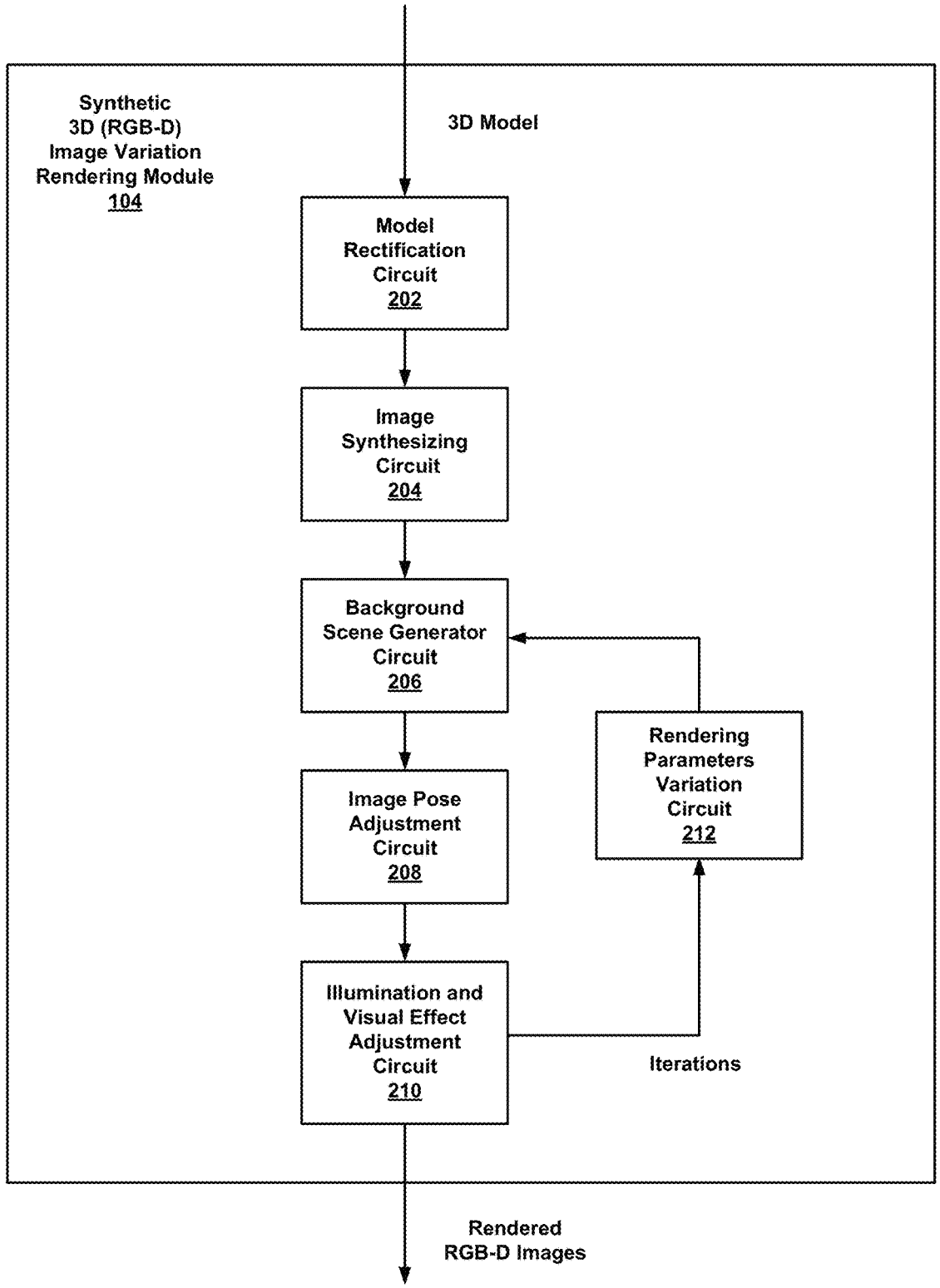
FIG. 2 is a more detailed block diagram of synthetic 3D image variation rendering module, configured in accordance with certain of the embodiments disclosed herein.

FIG. 2 is a more detailed block diagram 200 of synthetic 3D (RGB-D) image variation rendering module, configured in accordance with certain of the embodiments disclosed herein. The synthetic 3D (RGB-D) image variation rendering module 104 is shown to include a model rectification circuit 202, an image synthesizing circuit 204, a background scene generator circuit 206, an image pose adjustment circuit 208, an illumination and visual effect adjustment circuit 210 and a rendering parameters variation circuit 212, the operations of which will be explained in greater detail below. Of course, the order of the modules and circuit as illustrated represents one possible example and other variations are possible, for example pose adjustment could be performed before background scene generation.

The model rectification circuit 202 may be configured to scale the 3D model of the object to a normalized size and to translate the model to an origin point of a 3D coordinate system, as an optional initialization operation. This may be desirable to compensate for the fact that different 3D model generation techniques may produce models of arbitrary size, orientation and/or location relative to a given coordinate system. Rectification may thus ensure that all models are on a similar scale and share a common coordinate system, which may therefore facilitate the implementation and performance of subsequent processing modules and circuits described below.

The image synthesizing circuit 204 may be configured to synthesize a 3D (RGB-D) image pair of the object based on the 3D model of the object, using known techniques in light of the present disclosure. A relatively large number of 3D image variations may subsequently be rendered based on the synthesized 3D image of the object generated by this circuit. The number of variations may be in the range of hundreds, thousands or more. Any combination of the operations, performed by the components described below, may be applied to create each RGB-D rendering variation (i.e., for both the RGB image and the depth image).

The background scene generator circuit 206 may be configured to generate a background scene for each of the rendered image variations. Each rendered variation may include a potentially unique background scene, although it is also possible to re-use background scenes if desired. In some embodiments, the background scene generator may randomly select a background scene from a database of background scenes. In some embodiments, the background scene may be a 2D planar image located behind the object as illustrated in FIG. 3 below. In some embodiments, the background scene may be a more complex 3D constructed model. For example, there could be a table located inside a house, where the table is the object of interest and the floor and walls of the house serve as the background scene.

The image pose adjustment circuit 208 may be configured to adjust the pose (e.g., orientation and/or translation) of the object for each of the rendered image variations. Additionally, for example in the case of non-rigid objects, the image pose adjustment circuit may further adjust the pose of regions of the object, where the regions are associated with components or subcomponents of the object that may be free to move relative to each other. For example, if the object is a toy character figure, the figure may be rotated and/or translated to any orientation and position in the image space. Additionally, if the toy figure is meant to be non-rigid (e.g., flexible), the pose of the head, arms, and legs can be varied in each rendering. Renderings may be generated that include all possible (or practical) permutations and combinations of poses of the different components or sub-components of the object, as illustrated in FIG. 3B, described below.

The illumination and visual effect adjustment circuit 210 may be configured to adjust illumination of the object and/or of the generated background for each of the rendered image variations. The illumination may be adjusted or varied, for example from brighter to darker or vice versa, and, in some embodiments, the contrast of the object may also be varied. As a further example, some parts of the image may be shadowed while other parts are highlighted, or some parts of the object may be made to appear shiny while other parts are dulled. As yet a further example, the color of the lighting may be varied.

The illumination and visual effect adjustment circuit 210 may further be configured to adjust visual effects of the object and/or the background for each of the rendered image variations based on an application of simulated camera parameters. The simulated camera parameters may include, for example, lens focal length and lens aperture. Changing the lens focal length can change the field of view, for example from a wide angle effect to a telephoto effect. Changing the lens aperture can change the depth of field of the image (i.e., the range of depths at which the image and background is in focus).

The rendering parameters variation circuit 212 may be configured to generate parameters to control or select the desired effects for each iteration or variation. The parameters may control, for example, the pose adjustment and illumination and visual effects for the object and/or the background of the image. The selection of the parameters may be determined by an operator of the system, or may be predetermined based on the nature of the objects. The selection of the parameters may also be determined based on the type of classifier that is to be generated or the desired performance characteristics of the classifier.

It will further be appreciated that embodiments of the present disclosure may enable efficient scaling of a classifier system to recognize new real world objects. For example, an existing classifier that is trained to recognize different household accessories may be configured to recognize a new accessory by obtaining a 3D model of the new object from the manufacturer and processing that model using the techniques described above.

Figure 3A:
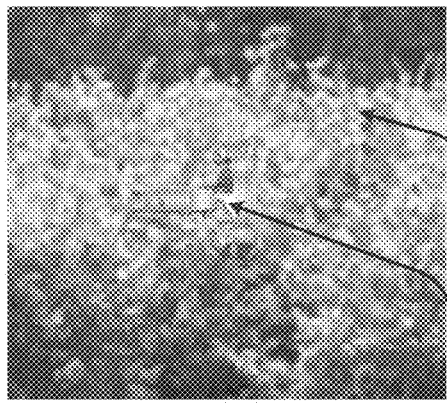
FIG. 3A illustrates example rendered variations of an object image, in accordance with certain of the embodiments disclosed herein.
Figure 3A:
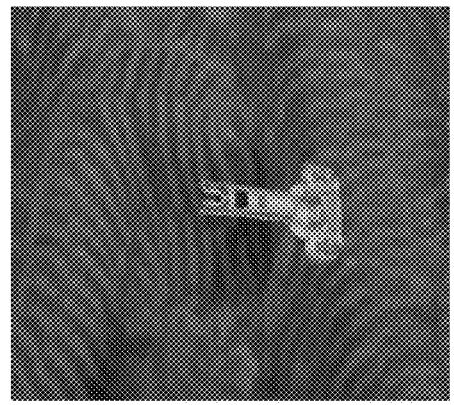
Figure 3A:
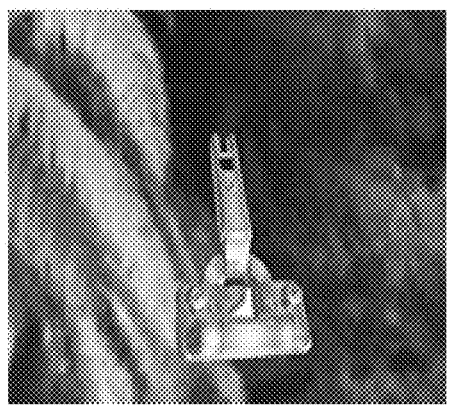
Figure 3A:
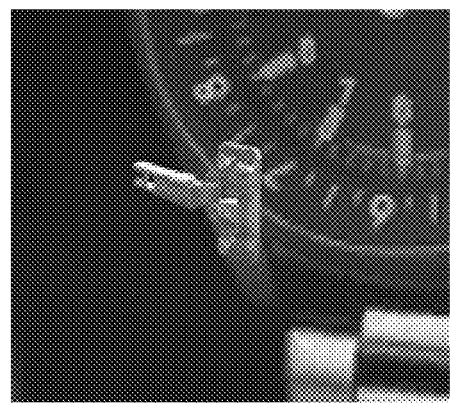
Figure 3A:
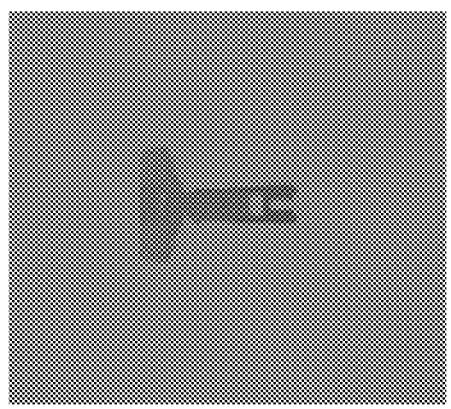
Figure 3A:
Figure 3B:
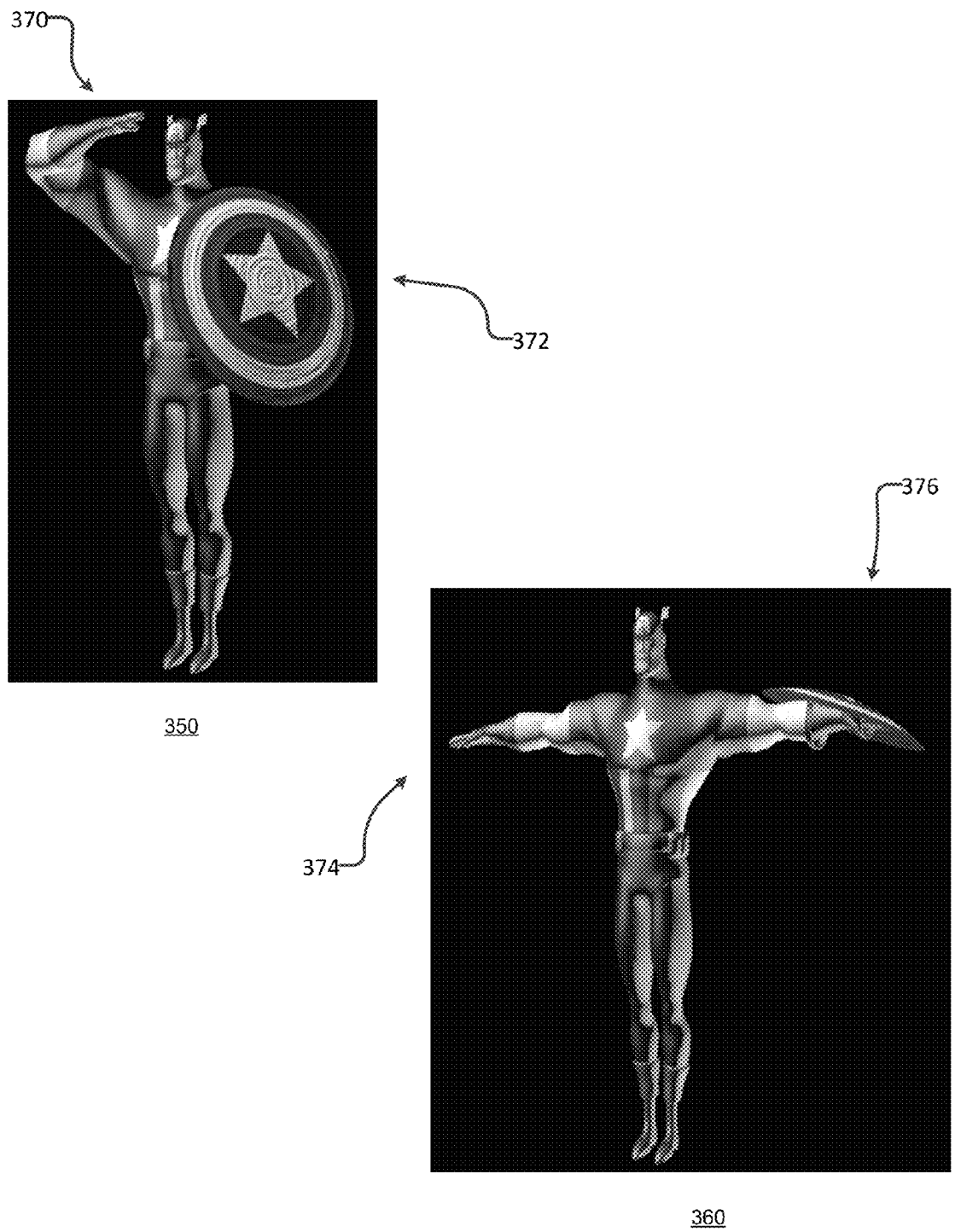
FIG. 3B illustrates additional examples of rendered variations of an object image, in accordance with certain of the embodiments disclosed herein.

FIG. 3A illustrates example rendered variations 300A of an object image, in accordance with certain of the embodiments disclosed herein. The object 330 is shown in various rendered images 302, 304, 306 and 308 illustrating the color or RGB component of the 3D image. In each image, the pose of the object (e.g., its position and orientation in space) is varied. Additionally, in each of the rendered images, the background 320 is seen to be changed, and the lighting is also varied. Images 310 and 312 illustrate example variations of the depth component of the 3D renderings. The depth component encodes each pixel as a grayscale value based on its distance from a virtual camera that would be producing these images.

FIG. 3B illustrates example rendered variations 300B of an object image, in accordance with certain of the embodiments disclosed herein. The object, a non-rigid toy figure, is shown to be rendered in a first pose 350 and a second pose 360. The pose of the right arm image subcomponent is shown to be varied from the position 370 to the position 374. Similarly, the pose of the left arm (and shield) is shown to be varied from position 372 to position 376.

Figure 4:
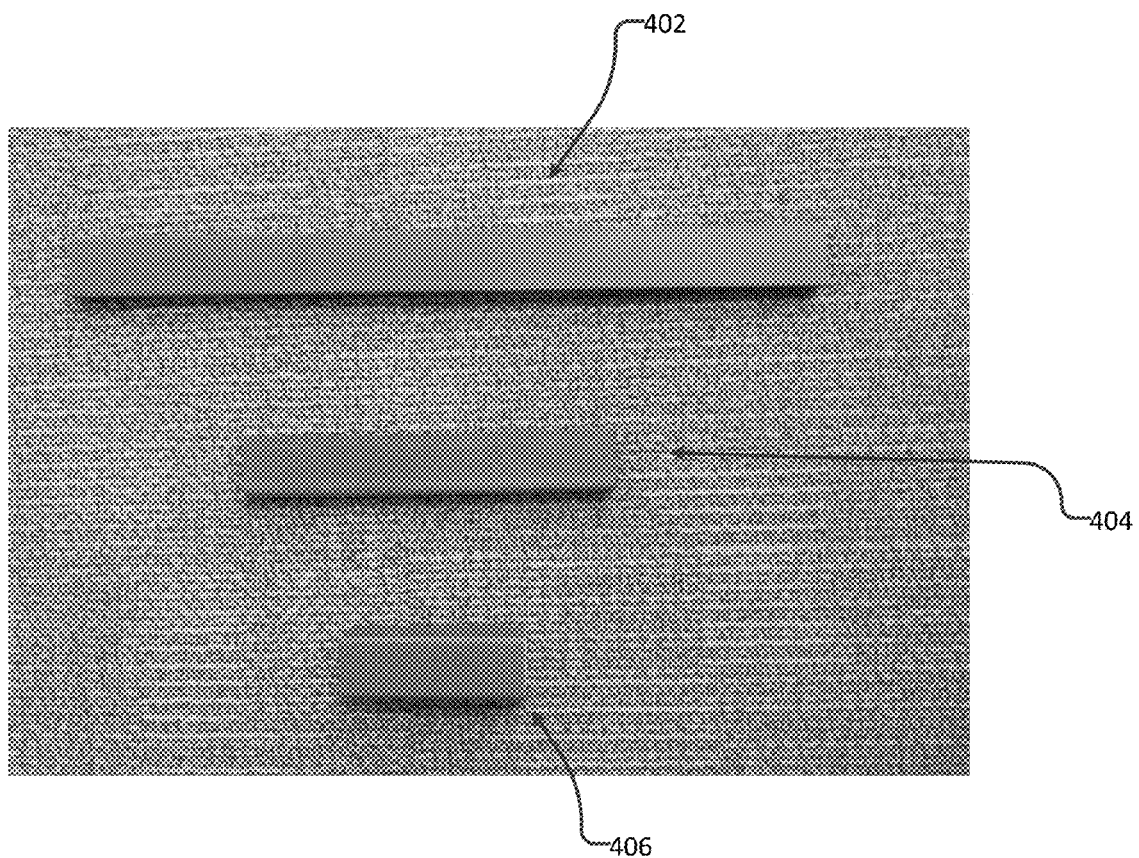
FIG. 4 illustrates examples of objects with similar shape and color characteristics but varying depth, in accordance with certain of the embodiments disclosed herein.

FIG. 4 illustrates examples of objects 400 with similar shape and color characteristics, in accordance with certain of the embodiments disclosed herein. Objects 402, 404 and 406 have similar shapes and coloring, which can typically lead to recognition ambiguity and/or false positives with recognition algorithms that operate using only color data. The varying dimensions, however, of each of these objects may be exploited to resolve such recognition ambiguities by using depth information. For this reason the synthetic 3D (RGB-D) image variation rendering module 104 is configured to render images that include both depth frames (e.g., 310 and 312) as well as color data frames (e.g., 302, 304, 306, 308).

Methodology

Figure 5A:
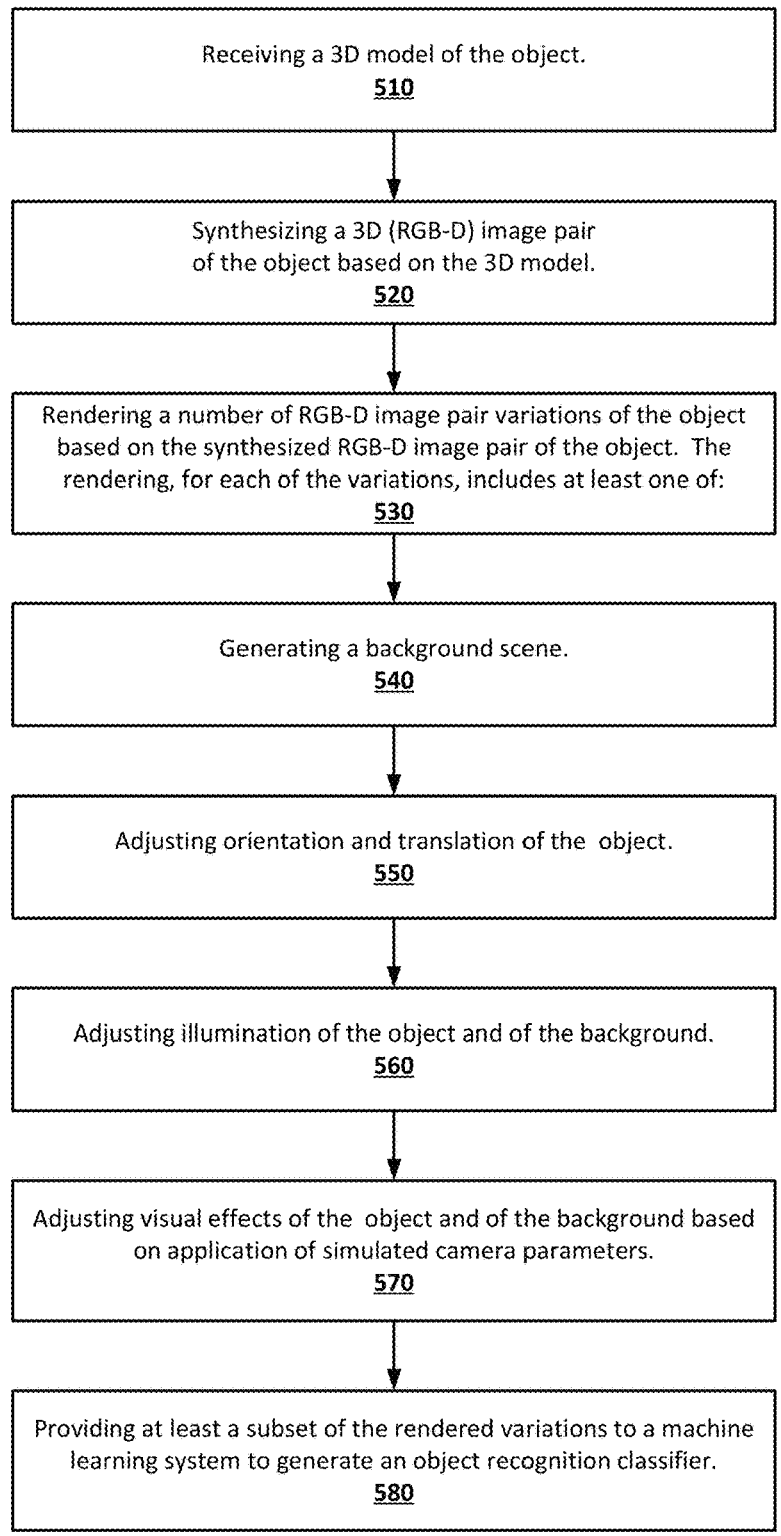
FIG. 5A is a flowchart illustrating a methodology for generating 3D object image variations, in accordance with certain of the embodiments disclosed herein.

FIG. 5A is a flowchart illustrating an example method 500 for generating 3D object image variations, in accordance with an embodiment of the present disclosure. As can be seen, example method 500 includes a number of phases and sub-processes, the sequence of which may vary from one embodiment to another. However, when considered in the aggregate, these phases and sub-processes form a process for generation of 3D object image variations in accordance with certain of the embodiments disclosed herein. These embodiments can be implemented, for example using the system architecture illustrated in FIGS. 1 and 2, as described above. However other system architectures can be used in other embodiments, as will be apparent in light of this disclosure. To this end, the correlation of the various functions shown in FIG. 5A to the specific components illustrated in FIGS. 1 and 2 is not intended to imply any structural and/or use limitations. Rather other embodiments may include, for example, varying degrees of integration wherein multiple functionalities are effectively performed by one system. For example, in an alternative embodiment a single module can be used to perform all of the functions of method 500. Thus other embodiments may have fewer or more modules and/or sub-modules depending on the granularity of implementation. Numerous variations and alternative configurations will be apparent in light of this disclosure.

As illustrated in FIG. 5A, in one embodiment, method 500 for generation of 3D object image variations commences by receiving, at operation 510, a 3D model of the object. The model may be generated by a computer aided design (CAD) tool, a 3D scanning tool, a 3D sculpting tool, or by other suitable techniques. Next, at operation 520, an RGB-D image pair of the object is synthesized based on the model. At operation 530, a number of RGB-D image pair variations are rendered based on the synthesized RGB-D image pair of the object. The number of variations may be in the range of hundreds, thousands, millions or more. Any combination of the following operations may be performed for each rendering variation.

At operation 540, a background scene is generated. In some embodiments, the background scene is randomly selected from a database of stored 2D background scenes. In some embodiments, a 3D background scene is generated. At operation 550, the pose (e.g., orientation and/or translation) of the object is adjusted or varied. At operation 560, the illumination of the object is adjusted or varied, for example from brighter to darker or vice versa. In some embodiments, the contrast of the object may also be varied.

At operation 570, other visual effects relative to the object and/or the background may be varied through the application of simulated camera parameters, such as, for example, lens focal length and lens aperture. Changing the lens focal length can change the field of view, for example from a wide angle effect to a telephoto effect. Changing the lens aperture can change the depth of field of the image (i.e., the range of depths at which the image is in focus).

Of course, in some embodiments, additional operations may be performed, as previously described in connection with the system. These additional operations may include, for example, in the case of non-rigid objects, adjusting an orientation and translation of a number of regions of the object, where the regions correspond to subcomponents of the object that could move relative to each other. Further additional operations may include, for example, rectifying the 3D model of the object to scale the model to a normalized size and to translate the model to an origin point of a 3D coordinate system. Additionally, in some embodiments, the rendered RGB-D image pair variations may be provided, at operation 580, to a machine learning system to generate an object recognition classifier or to test the classifier.

Figure 5B:
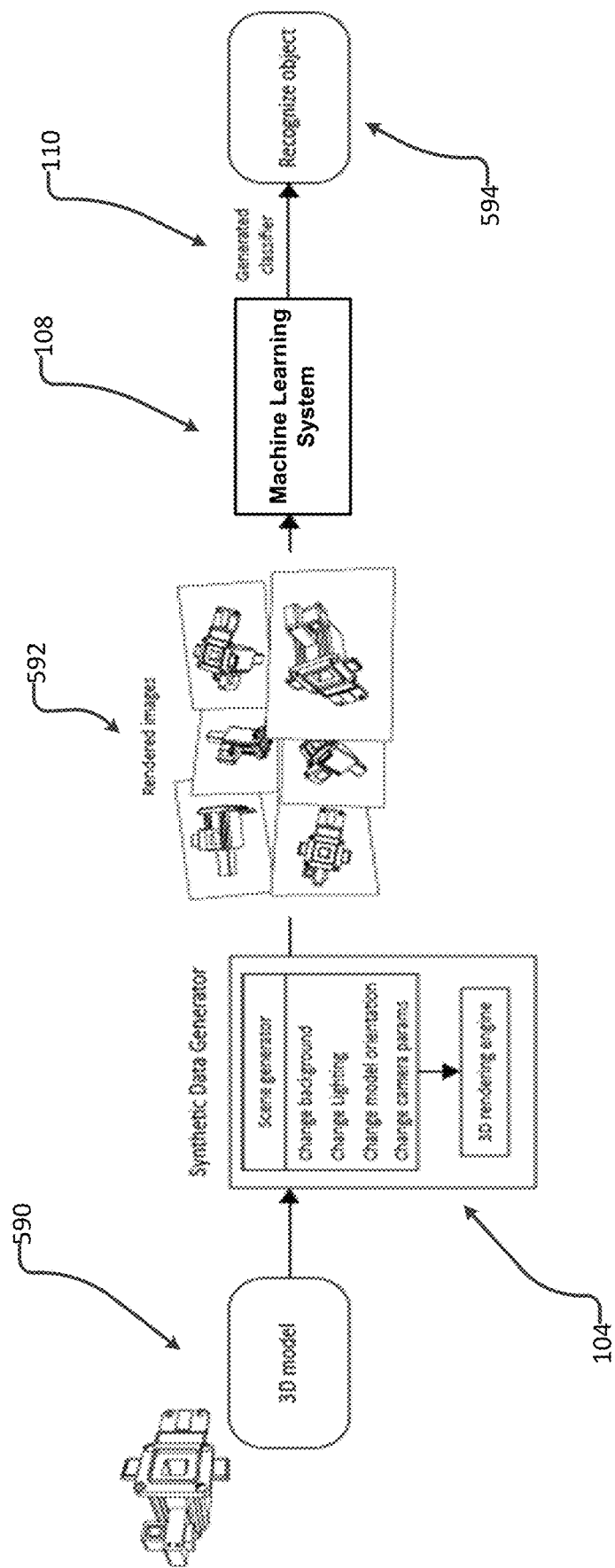
FIG. 5B is a block diagram graphically illustrating the methodology depicted in FIG. 5A, in accordance with an example embodiment.

FIG. 5B is a block diagram graphically illustrating the methodology depicted in FIG. 5A, in accordance with an example embodiment. A 3D model of an example object 590 is shown being provided to the synthetic 3D (RGB-D) image variation rendering module 104, as described in operation 510 above. In some embodiments, varying 3D scenes may be rendered, for example by module 104, by changing the background, changing the lighting, changing the modeled object orientation, and/or changing simulated camera parameters such as depth of field and angle of viewing field, as described in operations 550, 560 and 570 above. A number of rendered images 592 of the object are shown. Although 6 examples are shown for simplicity, in practice a larger number of renderings may be generated, perhaps on the order of thousands to millions of renderings. These rendered images 592 may be stored in a database and/or provided directly to machine learning system 108, as described in operation 580 above.

Machine learning system 108 may be configured to generate a recognition classifier 110 for the modeled object 590, for example based on training using the rendered images 592, or a subset thereof. The generated classifier 110 may then be employed to recognize instances of the object 590 in a variety of real world images or settings. In some embodiments, the synthetic 3D (RGB-D) image variation rendering module 104 and/or the machine learning system 108 may be hosted on a local system or on a cloud based system. For example a user may upload a 3D CAD model to a cloud based system where rendering and/or classifier training is performed.

Example System

Figure 6:
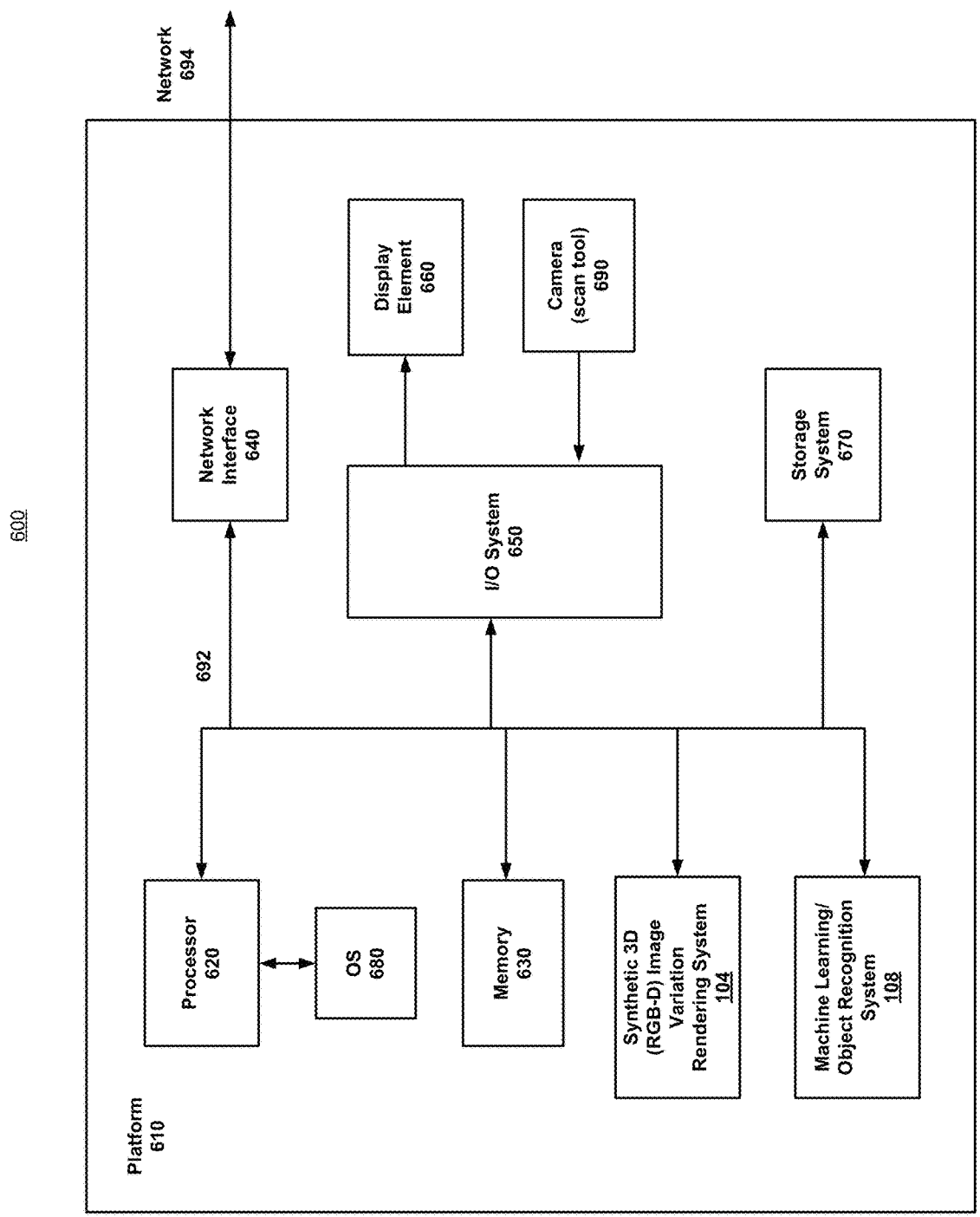
FIG. 6 is a block diagram schematically illustrating a system platform to render 3D object image variations, configured in accordance with certain of the embodiments disclosed herein.

FIG. 6 illustrates an example system 600 that may carry out rendering of 3D object image variations, based on a 3D model of the object, for provision to a machine learning system configured to generate a recognition classifier, as described herein. In some embodiments, system 600 comprises a platform 610 which may host, or otherwise be incorporated into a personal computer, workstation, laptop computer, ultra-laptop computer, tablet, touchpad, portable computer, robot or drone, handheld computer, palmtop computer, personal digital assistant (PDA), cellular telephone, combination cellular telephone and PDA, smart device (for example, smartphone or smart tablet), mobile internet device (MID), and so forth. Any combination of different devices may be used in certain embodiments. For example, classifier training, which is an offline process for creating a new classifier, may typically be performed on a more computationally powerful platform such as a desktop computer, workstation or cloud based computer. Recognition, which is an online process for recognizing objects in real-time, may generally be performed by a wider range of device types.

In some embodiments, platform 610 may comprise any combination of a processor 620, a memory 630, a synthetic 3D (RGB-D) image variation rendering system 104, a machine learning/object recognition system 108, a 2D or 3D camera or scanning tool 690, a network interface 640, an input/output (I/O) system 650, a display element 660, and a storage system 670. As can be further seen, a bus and/or interconnect 692 is also provided to allow for communication between the various components listed above and/or other components not shown. Platform 610 can be coupled to a network 694 through network interface 640 to allow for communications with other computing devices, platforms or resources. Other componentry and functionality not reflected in the block diagram of FIG. 6 will be apparent in light of this disclosure, and it will be appreciated that other embodiments are not limited to any particular hardware configuration.

Processor 620 can be any suitable processor, and may include one or more coprocessors or controllers, such as an audio processor or a graphics processing unit, to assist in control and processing operations associated with system 600. In some embodiments, the processor 620 may be implemented as any number of processor cores. The processor (or processor cores) may be any type or combination of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 620 may be implemented as a complex instruction set computer (CISC) or a reduced instruction set computer (RISC) processor. In some embodiments, processor 620 may be configured as an x86 instruction set compatible processor.

Memory 630 can be implemented using any suitable type of digital storage including, for example, flash memory and/or random access memory (RAM). In some embodiments, the memory 630 may include various layers of memory hierarchy and/or memory caches as are known to those of skill in the art. Memory 630 may be implemented as a volatile memory device such as, but not limited to, a RAM, dynamic RAM (DRAM), or static RAM (SRAM) device. Storage system 670 may be implemented as a non-volatile storage device such as, but not limited to, one or more of a hard disk drive (HDD), a solid state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 670 may comprise technology to increase the storage performance enhanced protection for valuable digital media when multiple hard drives are included.

Processor 620 may be configured to execute an Operating System (OS) 680 which may comprise any suitable operating system, such as Google Android (Google Inc., Mountain View, Calif.), Microsoft Windows (Microsoft Corp., Redmond, Wash.), Linux, or Apple OS X (Apple Inc., Cupertino, Calif.) and/or various real-time operating systems. As will be appreciated in light of this disclosure, the techniques provided herein can be implemented without regard to the particular operating system provided in conjunction with system 600, and therefore may also be implemented using any suitable existing or subsequently-developed platform.

Network interface module 640 can be any appropriate network chip or chipset which allows for wired and/or wireless connection between other components of computer system 600 and/or network 694, thereby enabling system 600 to communicate with other local and/or remote computing systems, servers, and/or resources. Wired communication may conform to existing (or yet to developed) standards, such as, for example, Ethernet. Wireless communication may conform to existing (or yet to developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 650 may be configured to interface between various I/O devices and other components of computer system 600. I/O devices may include, but not be limited to, a display element 660, camera or scan tool 690, and other devices not shown such as a keyboard, mouse, speaker, microphone, etc.

I/O system 650 may include a graphics subsystem configured to perform processing of images for display element 660. Graphics subsystem may be a graphics processing unit or a visual processing unit (VPU), for example. An analog or digital interface may be used to communicatively couple graphics subsystem and display element 660. For example, the interface may be any of a high definition multimedia interface (HDMI), DisplayPort, wireless HDMI, and/or any other suitable interface using wireless high definition compliant techniques. In some embodiment, the graphics subsystem could be integrated into processor 620 or any chipset of platform 610. In some embodiments, display element 660 may comprise any television type monitor or display, including liquid crystal displays (LCDs) and light emitting diode displays (LEDs). Display element 660 may comprise, for example, a computer display screen, touchscreen display, video monitor, television-like device, and/or a television. Display element 660 may be digital and/or analog. Under the control of the OS 680 (or one or more software applications), platform 610 may display processed images on display element 660. The images may be provided by camera/scan tool 690, or other sources, and processed by synthetic 3D (RGB-D) image variation rendering system 104, as described herein. Camera 690 may be configured to provide 2D or 3D images or scans of an object from which a 3D model of the object may be generated.

It will be appreciated that in some embodiments, the various components of the system 100 may be combined or integrated in a system-on-a-chip (SoC) architecture. In some embodiments, the components may be hardware components, firmware components, software components or any suitable combination of hardware, firmware or software.

Synthetic 3D (RGB-D) image variation rendering system 104 is configured to generate synthetic 3-dimensional object image variations from a 3D model of the object. These rendered image variations are then employed for training of recognition systems or classifiers, for example by machine learning/object recognition system 108. Synthetic 3D (RGB-D) image variation rendering system 104 may include any or all of the components illustrated in FIG. 2 and described above. Synthetic 3D (RGB-D) image variation rendering system 104 can be implemented or otherwise used in conjunction with a variety of suitable software and/or hardware that is coupled to or that otherwise forms a part of system 600. Synthetic 3D (RGB-D) image variation rendering system 104 can additionally or alternatively be implemented or otherwise used in conjunction with user I/O devices that are capable of providing information to, and receiving information and commands from, a user. These I/O devices may include display element 660, a textual input device such as a keyboard, and a pointer-based input device such as a mouse. Other input/output devices that may be used in other embodiments include a touchscreen, a touchpad, a speaker, and/or a microphone. Still other input/output devices can be used in other embodiments.

In some embodiments synthetic 3D (RGB-D) image variation rendering system 104 may be installed local to system 600, as shown in the example embodiment of FIG. 6. Alternatively, system 600 can be implemented in a client-server arrangement (or local and cloud based arrangement) wherein at least some functionality associated with synthetic 3D (RGB-D) image variation rendering system 104 is provided to system 600 using an applet, such as a JavaScript applet, or other downloadable module. Such a remotely accessible module or sub-module can be provisioned in real-time in response to a request from a client computing system for access to a given server having resources that are of interest to the user of the client computing system. In such embodiments the server can be local to network 694 or remotely coupled to network 694 by one or more other networks and/or communication channels. In some cases access to resources on a given network or computing system may require credentials such as usernames, passwords, and/or compliance with any other suitable security mechanism.

In various embodiments, system 600 may be implemented as a wireless system, a wired system, or a combination of both. When implemented as a wireless system, system 600 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, system 600 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example in one embodiment at least one non-transitory computer readable storage medium has instructions encoded thereon that, when executed by one or more processors, cause one or more of the methodologies for generating 3D object image variations, disclosed herein, to be implemented. The instructions can be encoded using a suitable programming language, such as C, C++, object oriented C, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, synthetic 3D (RGB-D) image variation rendering system 104 may generate image variations by leveraging processing resources provided by a remote computer system accessible via network 694. In other embodiments the functionalities disclosed herein can be incorporated into other software applications, such as image management applications. The computer software applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus in other embodiments system 600 may comprise additional, fewer, or alternative subcomponents as compared to those included in the example embodiment of FIG. 6.

The aforementioned non-transitory computer readable medium may be any suitable medium for storing digital information, such as a hard drive, a server, a flash memory, and/or random access memory (RAM). In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CR-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system onchip (SoC), desktop computers, laptop computers, tablet computers, servers, smart phones, etc. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a method for generating 3-Dimensional (3D) object image variations. The method comprises receiving a 3D model of the object and synthesizing a color and depth (RGB-D) image pair of the object based on the 3D model. The method also comprises rendering a plurality of RGB-D image pair variations of the object based on the synthesized RGB-D image pair of the object. The rendering comprising at least one of, for each of the variations: generating a background scene; adjusting an orientation and translation of the object; adjusting illumination of the object and of the background scene; and adjusting visual effects of the object and of the background scene based on application of simulated camera parameters. The method further comprises providing at least a first subset of the rendered RGB-D image pair variations to a machine learning system to generate an object recognition classifier.

Example 2 includes the subject matter of Example 1, further comprising, for non-rigid objects, adjusting an orientation and translation of each of a plurality of regions of the object, wherein the regions are associated with subcomponents of the object.

Example 3 includes the subject matter of Examples 1 and 2, further comprising rectifying the 3D model of the object to scale the model to a normalized size and to translate the model to an origin point of a 3D coordinate system.

Example 4 includes the subject matter of Examples 1-3, wherein the background scene generation further comprises randomly selecting a 2-Dimensional (2D) background scene from a database of background scenes.

Example 5 includes the subject matter of Examples 1-4, wherein the background scene generation further comprises generating a 3D background scene.

Example 6 includes the subject matter of Examples 1-5, wherein the simulated camera parameters comprise lens focal length and lens aperture.

Example 7 includes the subject matter of Examples 1-6, further comprising generating the 3D model of the object by employing a computer aided design (CAD) tool or a 3D scanning tool.

Example 8 includes the subject matter of Examples 1-7, wherein the rendering includes each of: generating a background scene; adjusting an orientation and translation of the object; adjusting illumination of the object and of the background scene; and adjusting visual effects of the object and of the background scene based on application of simulated camera parameters.

Example 9 includes the subject matter of Examples 1-8, further comprising providing a second subset of the rendered RGB-D image pair variations to the machine learning system to test the object recognition classifier.

Example 10 is a system to render 3-Dimensional (3D) object image variations. The system comprises: an image synthesizing circuit to synthesize a color and depth (RGB-D) image pair of the object based on a 3D model of the object. The system also comprise at least one of: a background scene generator circuit to generate a background scene for each of the rendered image variations; an image pose adjustment circuit to adjust an orientation and translation of the object for each of the rendered image variations; and an illumination and visual effect adjustment circuit to adjust illumination of the object and of the background scene for each of the rendered image variations, and to further adjust visual effects of the object and of the background scene for each of the rendered image variations based on application of simulated camera parameters. The system further comprises a rendering parameter variation circuit to generate parameters for each variation iteration, the parameters to control the pose adjustment or illumination and visual effects; and a machine learning system to generate an object recognition classifier based on at least a first subset of the rendered image variations.

Example 11 includes the subject matter of Example 10, wherein the image pose adjustment circuit is further to, for non-rigid objects, adjust an orientation and translation of each of a plurality of regions of the object, wherein the regions are associated with subcomponents of the object.

Example 12 includes the subject matter of Examples 10 or 11, further comprising a model rectification circuit to scale the model of the object to a normalized size and to translate the model to an origin point of a 3D coordinate system.

Example 13 includes the subject matter of Examples 10-12, wherein the background scene generator circuit is further to randomly select a 2-Dimensional (2D) background scene from a database of background scenes.

Example 14 includes the subject matter of Examples 10-13, wherein the simulated camera parameters comprise lens focal length and lens aperture.

Example 15 includes the subject matter of Examples 10-14, further comprising a 3D model generation module to generate the 3D model of the object based on a computer aided design (CAD) tool or a 3D scanning tool.

Example 16 includes the subject matter of Examples 10-15, wherein the system includes each of the background scene generator circuit; the image pose adjustment circuit; and the illumination and visual effect adjustment circuit.

Example 17 includes the subject matter of Examples 10-16, wherein the machine learning system is further to test the object recognition classifier based on a second subset of the rendered image variations.

Example 18 includes the subject matter of Examples 10-17, further comprising a database to store the rendered image variations.

Example 19 is at least one non-transitory computer readable storage medium having instructions encoded thereon that, when executed by one or more processors, result in the following operations for generating 3-Dimensional (3D) object image variations. The operations comprise: receiving a 3D model of the object and synthesizing a color and depth (RGB-D) image pair of the object based on the 3D model. The operations also comprise rendering a plurality of RGB-D image pair variations of the object based on the synthesized RGB-D image pair of the object. The rendering comprising at least one of, for each of the variations: generating a background scene; adjusting an orientation and translation of the object; adjusting illumination of the object and of the background scene; and adjusting visual effects of the object and of the background scene based on application of simulated camera parameters. The operations further comprise providing at least a first subset of the rendered RGB-D image pair variations to a machine learning system to generate an object recognition classifier.

Example 20 includes the subject matter of Example 19, further comprising, for non-rigid objects, adjusting an orientation and translation of each of a plurality of regions of the object, wherein the regions are associated with subcomponents of the object Example 21 includes the subject matter of Examples 19 and 20, further comprising rectifying the 3D model of the object to scale the model to a normalized size and to translate the model to an origin point of a 3D coordinate system.

Example 22 includes the subject matter of Examples 19-21, wherein the background scene generation further comprises randomly selecting a 2-Dimensional (2D) background scene from a database of background scenes.

Example 23 includes the subject matter of Examples 19-22, wherein the background scene generation further comprises generating a 3D background scene.

Example 24 includes the subject matter of Examples 19-23, wherein the simulated camera parameters comprise lens focal length and lens aperture.

Example 25 includes the subject matter of Examples 19-24, further comprising generating the 3D model of the object by employing a computer aided design (CAD) tool or a 3D scanning tool.

Example 26 includes the subject matter of Examples 19-25, wherein the rendering includes each of: generating a background scene; adjusting an orientation and translation of the object; adjusting illumination of the object and of the background scene; and adjusting visual effects of the object and of the background scene based on application of simulated camera parameters.

Example 27 includes the subject matter of Examples 19-26, further comprising providing a second subset of the rendered RGB-D image pair variations to the machine learning system to test the object recognition classifier.

Example 28 is a system for generating 3-Dimensional (3D) object image variations. The system comprises: means for receiving a 3D model of the object and means for synthesizing a color and depth (RGB-D) image pair of the object based on the 3D model. The system also comprises means for rendering a plurality of RGB-D image pair variations of the object based on the synthesized RGB-D image pair of the object. The means for rendering comprises at least one of, for each of the variations: means for generating a background scene; means for adjusting an orientation and translation of the object; means for adjusting illumination of the object and of the background scene; and means for adjusting visual effects of the object and of the background scene based on application of simulated camera parameters. The system further comprises means for providing at least a first subset of the rendered RGB-D image pair variations to a machine learning system to generate an object recognition classifier.

Example 29 includes the subject matter of Example 28, further comprising, for non-rigid objects, means for adjusting an orientation and translation of each of a plurality of regions of the object, wherein the regions are associated with subcomponents of the object.

Example 30 includes the subject matter of Examples 28 and 29, further comprising means for rectifying the 3D model of the object to scale the model to a normalized size and to translate the model to an origin point of a 3D coordinate system.

Example 31 includes the subject matter of Examples 28-30, wherein the background scene generation further comprises means for randomly selecting a 2-Dimensional (2D) background scene from a database of background scenes.

Example 32 includes the subject matter of Examples 28-31, wherein the background scene generation further comprises means for generating a 3D background scene.

Example 33 includes the subject matter of Examples 28-32, wherein the simulated camera parameters comprise lens focal length and lens aperture.

Example 34 includes the subject matter of Examples 28-33, further comprising means for generating the 3D model of the object by employing a computer aided design (CAD) tool or a 3D scanning tool.

Example 35 includes the subject matter of Examples 28-34, wherein the means for rendering includes each of: means for generating a background scene; means for adjusting an orientation and translation of the object; means for adjusting illumination of the object and of the background scene; and means for adjusting visual effects of the object and of the background scene based on application of simulated camera parameters.

Example 36 includes the subject matter of Examples 28-35, further comprising means for providing a second subset of the rendered RGB-D image pair variations to the machine learning system to test the object recognition classifier.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A processor-implemented method for generating 3-Dimensional (3D) object image variations, the method comprising:
   synthesizing a color and depth (RGB-D) image pair of an object based on a 3D model of the object; and
   rendering a plurality of RGB-D image pair variations of the object based on the synthesized RGB-D image pair of the object, the rendering comprising, for each of the variations, adjusting visual effects of the object and of a generated background scene based on application of simulated camera parameters.

2. The method of claim 1, further comprising generating an object recognition classifier based on at least a subset of the rendered RGB-D image pair variations.

3. The method of claim 1, further comprising adjusting an orientation and translation of each of a plurality of regions of the object, wherein the regions are associated with subcomponents of the object.

4. The method of claim 1, further comprising rectifying the 3D model of the object to scale the model to a normalized size and to translate the model to an origin point of a 3D coordinate system.

5. The method of claim 1, wherein the generated background scene comprises a 2-Dimensional (2D) background scene randomly selected from a database of background scenes.

6. The method of claim 1, wherein the generated background scene comprises a 3D background scene.

7. The method of claim 1, wherein the simulated camera parameters comprise lens focal length and lens aperture.

8. The method of claim 1, wherein the rendering further comprises adjusting an orientation and translation of the object and adjusting illumination of the object and of the background scene.

9. A system to render 3-Dimensional (3D) object image variations, the system comprising:
an image synthesizing circuit to synthesize a color and depth (RGB-D) image pair of an object based on a 3D model of the object; and
a visual effect adjustment circuit to adjust visual effects of the object and of a background scene, for each of a plurality of rendered image variations, based on application of simulated camera parameters.

10. The system of claim 9, further comprising a machine learning system to generate an object recognition classifier based on at least a subset of the rendered image variations.

11. The system of claim 9, further comprising an image pose adjustment circuit to adjust an orientation and translation of each of a plurality of regions of the object, wherein the regions are associated with subcomponents of the object.

12. The system of claim 9, further comprising a model rectification circuit to scale the 3D model of the object to a normalized size and to translate the scaled model to an origin point of a 3D coordinate system.

13. The system of claim 9, further comprising a background scene generator circuit to randomly select the background scene from a database of 2-Dimensional (2D) background scenes.

14. The system of claim 9, wherein the simulated camera parameters comprise lens focal length and lens aperture.

15. At least one non-transitory computer readable storage medium having instructions encoded thereon that, when executed by one or more processors, result in the following operations for generating 3-Dimensional (3D) object image variations, the operations comprising:
synthesizing a color and depth (RGB-D) image pair of an object based on a 3D model of the object; and
rendering a plurality of RGB-D image pair variations of the object based on the synthesized RGB-D image pair of the object, the rendering comprising, for each of the variations, adjusting visual effects of the object and of a generated background scene based on application of simulated camera parameters.

16. The computer readable storage medium of claim 15, further comprising generating an object recognition classifier based on at least a subset of the rendered RGB-D image pair variations.

17. The computer readable storage medium of claim 15, further comprising adjusting an orientation and translation of each of a plurality of regions of the object, wherein the regions are associated with subcomponents of the object.

18. The computer readable storage medium of claim 15, further comprising rectifying the 3D model of the object to scale the model to a normalized size and to translate the model to an origin point of a 3D coordinate system.

19. The computer readable storage medium of claim 15, wherein the generated background scene comprises a 2-Dimensional (2D) background scene randomly selected from a database of background scenes.

20. The computer readable storage medium of claim 15, wherein the generated background scene comprises a 3D background scene.

21. The computer readable storage medium of claim 15, wherein the simulated camera parameters comprise lens focal length and lens aperture.

22. The computer readable storage medium of claim 15, wherein the rendering further comprises adjusting an orientation and translation of the object and adjusting illumination of the object and of the background scene.

\* \* \* \* \*